Figure 1A:
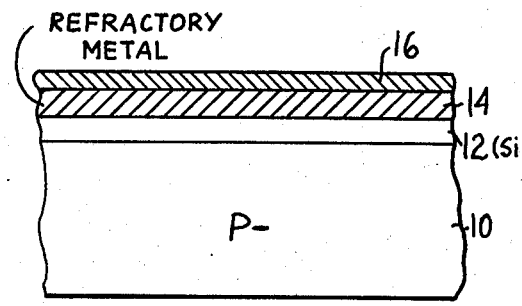

United States Patent [19]

Richman

[11] 4,282,647

[45] Aug. 11, 1981

[54] METHOD OF FABRICATING HIGH DENSITY REFRACTORY METAL GATE MOS INTEGRATED CIRCUITS UTILIZING THE GATE AS A SELECTIVE DIFFUSION AND OXIDATION MASK

[75] Inventor: Paul Richman, St. James, N.Y.

[73] Assignee: Standard Microsystems Corporation, Hauppauge, N.Y.

[21] Appl. No.: 79,163

[22] Filed: Sep. 26, 1979

Related U.S. Application Data

[63] Continuation-in-part of Ser. No. 893,336, Apr. 4, 1978, abandoned.

[51] Int. Cl.$^3$ .................. H01L 21/223; H01L 21/283
[52] U.S. Cl. ........................................ 29/571; 29/578; 148/1.5; 148/187; 156/652; 156/653; 156/656; 156/664; 357/23; 357/54; 427/93
[58] Field of Search ............... 29/571, 578; 148/1.5, 148/187; 427/93; 156/653, 652, 656, 664; 357/23, 54

[56] References Cited

U.S. PATENT DOCUMENTS

| | | | |
|---|---|---|---|
| 3,566,517 | 3/1971 | Brown et al. | 29/571 |
| 3,614,829 | 10/1971 | Burgess et al. | 29/571 |
| 3,646,665 | 3/1972 | Kim | 148/187 X |
| 3,676,921 | 7/1972 | Kooi | 29/578 X |
| 3,748,187 | 7/1973 | Aubuchon et al. | 148/1.5 |
| 3,752,211 | 8/1973 | Kooi et al. | 148/187 X |
| 3,936,859 | 2/1976 | Dingwall | 357/23 |
| 3,966,501 | 6/1976 | Nomura et al. | 148/1.5 |
| 3,967,981 | 7/1976 | Yamazaki | 29/571 X |
| 4,149,307 | 4/1979 | Henderson | 29/571 |
| 4,160,987 | 7/1979 | Dennard et al. | 29/571 X |

*Primary Examiner*—L. Dewayne Rutledge
*Assistant Examiner*—W. G. Saba
*Attorney, Agent, or Firm*—Hopgood, Calimafde, Kalil, Blaustein & Judlowe

[57] ABSTRACT

A method for fabricating an MOS integrated circuit having a refractory metal gate structure includes the formation of an insulating layer and a conductive refractory metal layer on a substrate, followed by the selective removal of portions of these layers to define the locations of source, drain, and other diffused regions. After the diffusion or implantation of the drain and source regions, using the refractory metal as a mask, the refractory metal, other than at the gate regions, is removed, and the portion of the underlying insulating layer that is thereby exposed is then etched away. An oxidizing step is performed to form a thick oxide region at those areas of the substrate not covered by the remaining portions of the refractory metal layer. Also disclosed is an MOS refractory metal gate MOS device fabricated by the method.

11 Claims, 10 Drawing Figures

METHOD OF FABRICATING HIGH DENSITY REFRACTORY METAL GATE MOS INTEGRATED CIRCUITS UTILIZING THE GATE AS A SELECTIVE DIFFUSION AND OXIDATION MASK

This is a continuation-in-part of application Ser. No. 893,336 filed on Apr. 4, 1978, now abandoned.

The present invention relates generally to MOS devices, and more particularly to a method for fabricating an MOS integrated circuit having a refractory metal gate structure.

The advantages of the use of refractory metal and polycrystalline silicon gate electrodes in insulated-gate field effect transistors are well known. For example, in a refractory metal gate MOS device, the inherent self-alignment of the gate to the source and drain regions results in reduced gate-to-drain and gate-to-source capacitances as compared to a conventional metal (aluminum)-gate structure. There remain, however, significant benefits and advantages in aluminum-gate MOS devices, such as in the design of read-only memories (ROMs) in which contact holes to the memory cell are not required, as contrasted to a conventional silicon-gate ROM or refractory metal gate ROM in which, at a minimum, one contact hole is required for every two bits of data. The need for contact holes in the conventional silicon-gate or refractory metal gate ROM increases the size of each cell, thereby reducing the density of data storage, as well as significantly reducing the yield of the fabricated memories.

The ability to fabricate MOS devices in the smallest possible area, thereby to achieve the desired high density of MOS devices in a given area of wafer, is desired in practically all MOS devices, and is particularly important in MOS ROMs, which typically include a large number of MOS devices. The density of MOS devices that can be achieved by the use of the known fabrication techniques is further limited in an aluminum gate device by the need to extend the metalization beyond the limits of the gate oxide region in each cell, typically by 0.1 mil on each side, and in a conventional silicon gate or refractory metal gate MOS device because of, as aforesaid, the need to form contact holes to the ROM cell.

It is thus an object of the present invention to provide a process for fabricating a refractory metal gate MOS device, which offers some of the freedom of memory design that has heretofore been available only in the design of aluminum gate MOS devices.

It is another object of the invention to provide a process for fabricating refractory metal gate MOS devices that has particular utility in the fabrication of read-only memories.

It is yet a further object of the invention to provide a process for fabricating refractory metal gate MOS devices in which individual MOS devices can be fabricated in a smaller unit area than has heretofore been attainable with conventional fabrication techniques.

Figure 1D:
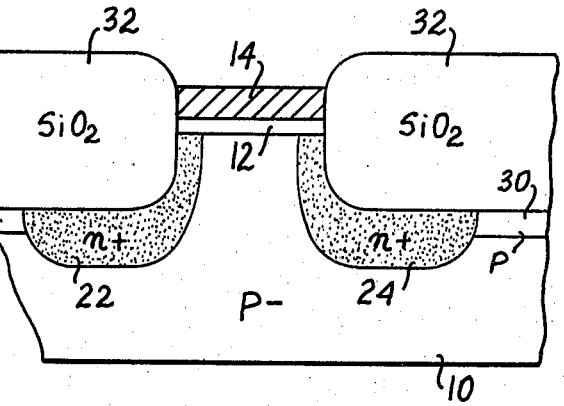
Figure 1B:
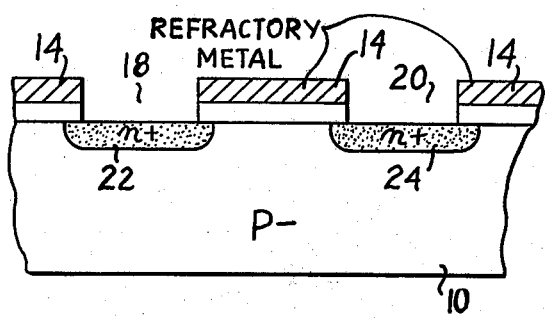
Figure 1E:
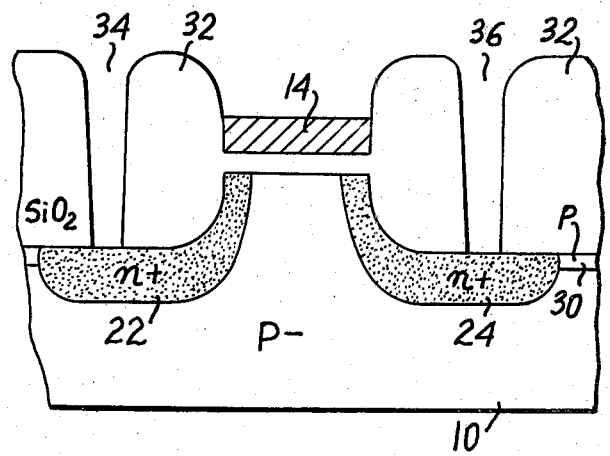
Figure 1C:
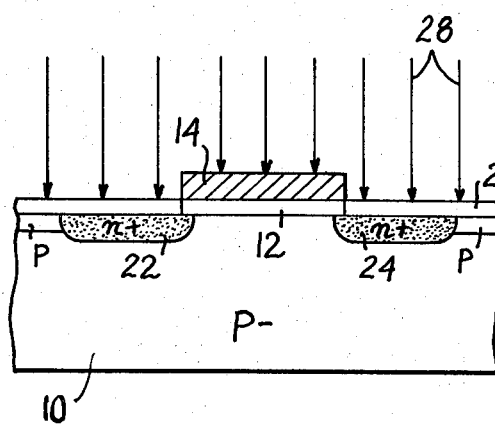
Figure 1F:
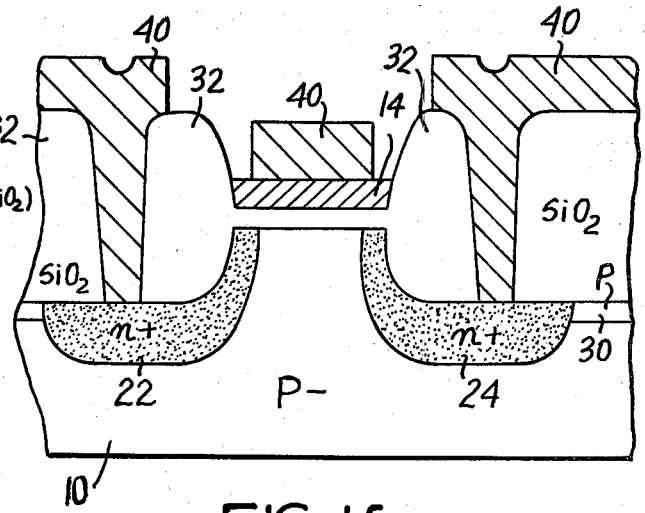
Figure 2A:
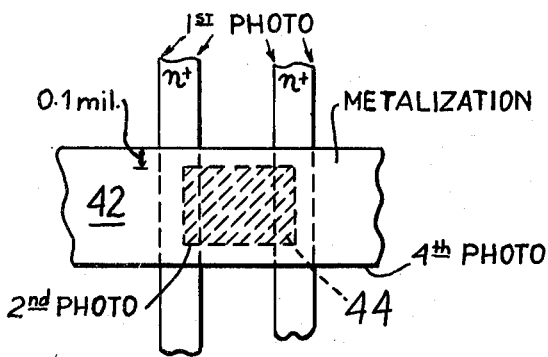
Figure 2B:
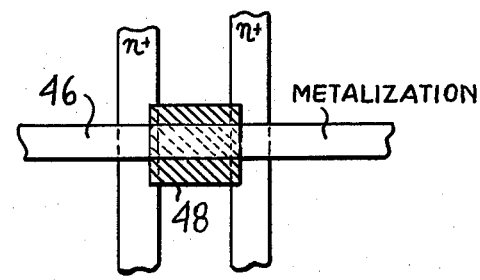
Figure 3A:
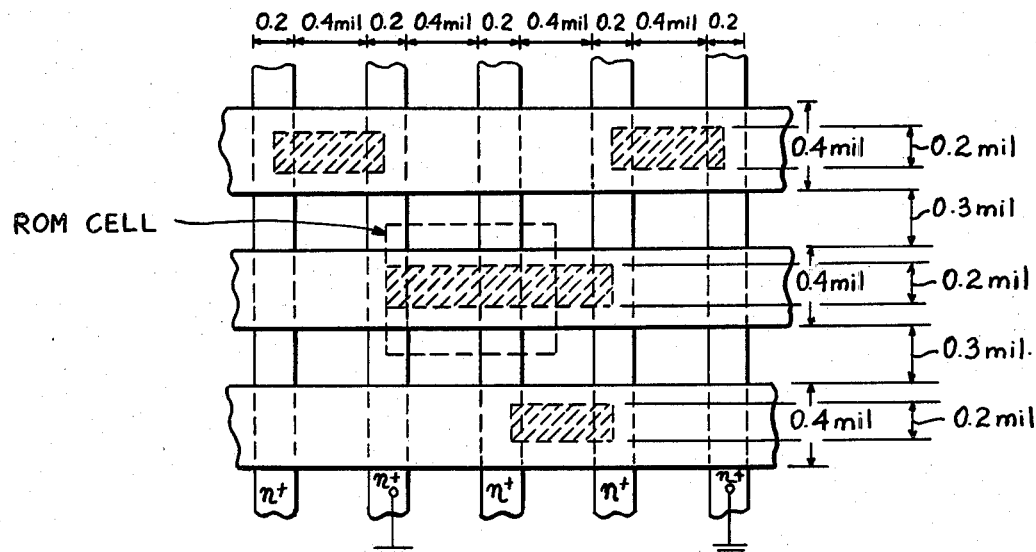

To the accomplishment of the above and to such further objects as may hereinafter appear, the present invention relates to the fabrication of refractory metal gate MOS devices substantially as set forth in the appended claims, and as described in the accompanying specification as considered with the accompanying drawings, in which:

FIGS. 1(a)-1(f) schematically illustrate an MOS device at various stages of fabrication, a completed device being shown in FIG. 1(f);

FIGS. 2(a) and 2(b) respectively schematically illustrate the space tolerances required in certain photolithographic operations performed in a conventional aluminum gate fabrication operation and in a refractory metal gate fabrication process according to the invention; and FIGS. 3(a) and (b) respectively illustrate a portion of a read-only memory matrix fabricated by a conventional aluminumgate technique and by the refractory metal gate process of the invention.

The invention, according to one embodiment thereof, is herein described with respect to the fabrication of an n-channel field-doped structure, although it is to be understood that the invention is applicable with equal advantage to the fabrication of p-channel field doped and p-channel non-field-doped MOS devices.

Referring now to the embodiment of the invention illustrated in FIGS. 1(a)-(f), the process begins with the provision of a p-type (100) silicon wafer or substrate 10 on which is thermally grown a relatively thin (500 Å to 1,500 Å) layer 12 of silicon dioxide, $SiO_2$. Layer 12 may also be in the form of a thin layer of $SiO_2$ covered by an overlying thin layer of $Si_3N_4$, $Al_2O_3$ or another comparable dielectric material. Layer 12 is immediately covered with a thicker (in the order of 1,000 Å to 5,000 Å) layer 14 of a refractory metal, or refractory metal alloy, such as platinum, rhodium, or molybdenum silicide, upon which a layer 16 of masking material, such as a photoresist, is deposited. The resulting structure is illustrated in FIG. 1(a).

Thereafter, a first photolithographic operation is performed on the structure of FIG. 1(a) to define the locations of the source, drain, and diffused regions in the upper surface of the substrate. Portions of the layer of masking material 16 are selectively removed from these regions, and then, using the remaining portions of the layer of masking material as a mask, all exposed portions of the refractory metal layer 14 and the underlying portion of the oxide layer 12 are removed, as by etching, to define openings 18 and 20. Thereafter, the remaining portions of layer 16 are removed and n+-type impurities are introduced, such as by diffusion or implantation, through openings 18 and 20 into the exposed surface of the substrate, thereby to produce the n+ source and drain regions 22 and 24, respectively. The structure at the completion of this step is shown in FIG. 1(b).

A second photolithographic operation is then performed to remove the portions of the layer 14 of the refractory metal over the parasitic or field regions, allowing the refractory metal layer to remain over all gate regions and at selected regions, such as where refractory metal interconnections and MOS capacitors are to be formed. Next, all of the exposed regions of silicon dioxide are etched away and, as shown in FIG. 1(c), a thin (in the order of 1,000 Å) layer 26 of silicon dioxide is thermally grown over the unprotected source, drain, and field regions, after which a low-level implant of boron $B_{11}+$ ions, indicated at 28, is carried out into and through the oxide layer 26 and into the source, drain, and field regions, the remaining refractory metal layer at the gate region acting as an implantation barrier. This implantation creates a p-type layer 30 at the field regions for the purposes set forth in U.S. Pat. No. 3,751,722. The structure at the completion of this stage of the process is illustrated in FIG. 1(c).

The wafer structure of FIG. 1(c) is then placed into an oxidizing environment, whereby the portions of the wafer not protected by the refractory metal layer 14 are oxidized to form a thick oxide region 32 at the field regions and overlying layer 30, as shown in FIG. 1(d). In addition to having to withstand the high temperatures normally associated with diffusions, the refractory metal layer 14 must also have the ability to resist oxidation or, at least, to oxidize at a relatively low rate. Materials such as platinum, rhodium, or molybdenum silicide are advantageous in this regard, whereas other materials, which sublime or rapidly oxidize under oxidation conditions that are frequently found in integrated circuit fabrication procedures, would not be acceptable.

Thereafter, any oxide which may have formed on the top surface of the layer 14 of the refractory metal is etched away, after which the wafer is coated with a photoresist and a third photolithographic process is carried out to define all contact hole locations (if desired) to the n+ source and drain regions. These contact holes 34 and 36 are then etched out down to the surface of the substrate at the source and drain regions, the photoresist is removed, and a critical cleaning operation is performed. The structure at this stage is illustrated in FIG. 1(e).

To complete the device, any known metalization layer which, may be, for example, an alloy of aluminum and silicon, or almost pure aluminum, is uniformly deposited over the surface of the wafer. In order to improve the electrical contact between the refractory metal and the aluminum, an intermediate metal such as platinum, titanium, gold, or combinations or alloys thereof may be employed. The wafer is then covered with a photoresist and a fourth photolithographic operation is performed to define the metalization interconnect pattern as shown at 40, after which the unwanted metalization is etched away. The wafer is alloyed to remove any residual fast surface states and to provide good metal-to-metal and metal-to-silicon contacts. The thus completed MOS structure is shown in FIG. 1(f). If desired, a passivation layer, such as silicon dioxide or silicon nitride, may be deposited over the structure and a fifth photolithographic operation performed to open up "windows" to the bonding pad locations.

The MOS device fabricated according to the invention, as shown in FIG. 1(f), has a refractory metal gate that is selfaligned to the source and drain regions, but in contrast to conventional silicon-gate devices, the refractory metal gate MOS device of the invention has a thick oxide region that surrounds, but does not cover, the refractory metal gate. Moreover, the thick oxide region of the MOS device of the invention is completely thermally grown over the field region rather than being grown pyrolitically, as in conventional silicon gate fabrication. The provision of a thick oxide region composed of completely thermally grown silicon dioxide rather than pyrolitically grown oxide is highly advantageous since the dielectric breakdown strength of the thermally grown oxide is significantly higher than that of the pyrolitically grown oxide. As a result, the possibility of edge shorting between the refractory metal gate and the diffused source and drain regions is practically eliminated, and the gate dielectric rupture strength of the device is increased considerably compared with the conventional silicon gate device for typical gate oxide thicknesses on the order of 1,000 Å.

Moreover, MOS devices made according to the invention have greater freedom with respect to the topological layout of devices, such as ROMs, as compared to conventional silicon gate techniques. Since the conducting gate layer is not covered by oxide, and thus can be directly connected to the metalization, a ROM cell made up of the refractory metal gate MOS device of the invention does not require the formation of contact holes to the cell, as is required in a conventionally fabricated silicon-gate ROM cell. Yet, the refractory metal gate electrode of the MOS device fabricated by the invention provides the many benefits associated with this type of structure, as described above. In addition, the sheet resistivities normally associated with refractory materials such as platinum, rhodium and molybdenum silicide are usually substantially lower than the sheet resistivity of highly-doped polycrystalline silicon, thereby realizing lower R-C time constants and substantial improvement in circuit speeds.

The fabrication of refractory metal gate MOS devices according to the invention also introduces less rigid layout or geometrical design rules. That is, in conventional aluminumgate layout rules, as illustrated in FIG. 2(a), the aluminum metalization regions, such as region 42, must always lie at least 0.1 mil outside (in the channel width direction) of the second photolithographic cuts which form the gate (or contact) locations such as 44, to ensure proper reliable contact between the metalization and the gate (or contact) locations. However, since the gate locations in the process of the invention are formed with conductive refractory metal at the location of an active MOS device, this limitation is no longer necessary. Rather than having to cover the gate cut completely with metal, as is normal practice in conventional aluminum gate MOS devices, the aluminum interconnection in the device fabricated by the present invention need only partially cover the refractory metal gate in order to ensure the making of ohmic contact with the gate. Furthermore, because of the spherical shape of the sidewalls of the locally oxidized silicon dioxide, step coverage of the aluminum interconnection over the gate region is no longer a major problem.

Thus, in an MOS device fabricated according to the invention, the aluminum metalization layer 46, as shown in FIG. 2(b), can be coincident with the refractory metal gate, or can lie within the location of the refractory metal gate, such as at 48, since the refractory metal gate is not covered with oxide, and thus can be contacted, at any portion thereof, by the aluminum metalization layer to make reliable contact therewith.

Figure 3B:
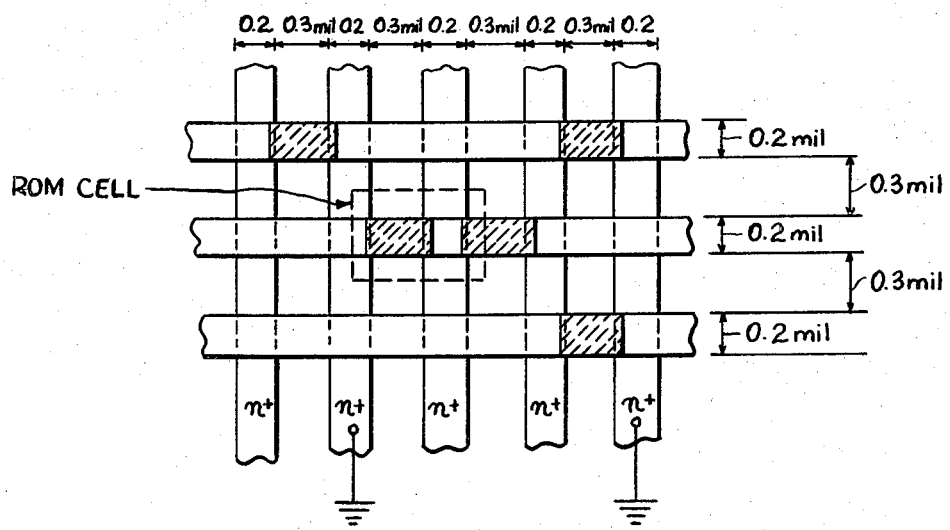

The resulting reduction in the metal width around the gate locations has significant advantages with respect to the possible density of MOS devices, as illustrated in FIG. 3(b), which illustrates a layout of a ROM matrix fabricated according to the process of the invention, as compared to a comparable ROM matrix shown in FIG. 3(a), which employs conventional fabrication techniques to form aluminum-gate ROM cells.

As can be seen in the conventional ROM matrix of FIG. 3(a), 0.1 mil edge spacing of the metalization layer with respect to the gate locations in the matrix is required, whereas in the ROM matrix containing refractory metal-gate MOS devices, as fabricated according to the invention, the metalization layer is substantially coextensive with the gate regions.

In the ROM matrixes illustrated in FIGS. 3(a) and (b), it is assumed that either an arsenic n+ diffusion or implantation is used to dope the n+ regions, and the boron implantation of the field regions, coupled with the minimum spreading of the n+ impurities, allows the use of 0.3 mil n+-to n+-spacing as opposed to 0.4 mil spacing required in the conventional layout.

The size of a ROM cell, as fabricated by the present invention, is thus typically $0.75 \times 0.5$ mil = 0.375 mil$^2$ compared to the conventional ROM cell, which is typically $0.9$ mil $\times 0.7$ mil = 0.63 mil$^2$; such that the size of the ROM cell that can be fabricated by the invention is typically about 40 percent less than that of the conventional ROM cell. Even further reduction in the size of the ROM cell may be achieved if 0.2 mil metal-to-metal spacing is allowed.

It will be appreciated from the foregoing description that the present invention offers an improved technique for fabricating MOS devices which provides the heretofore mutually exclusive benefits of conventional aluminum-gate and silicon-gate or refractory metal gate techniques, and which further permits the fabrication of MOS devices at a greater density than has heretofore been feasible with the known fabrication techniques. It will also be appreciated that although a number of materials have been described as the refractory metal used in the process of the invention, other refractory metals could also be used to advantage in the practice of the invention.

It will thus be appreciated that although the invention has been herein specifically described with respect to one embodiment, modifications and variations may be made therein by those skilled in the art without necessarily departing from the spirit and scope of the invention.

What is claimed is:

1. A process for fabricating as MOS device comprising the steps of (a) providing a substrate of a first conductivity type, (b) forming on said substrate an insulating layer and an overlying refractory metal layer, (c) selectively removing portions of said refractory metal and the underlying portion of said insulating layer to define openings at the locations of source and drain regions, (d) introducing impurities of an opposite conductivity type through said openings into the exposed upper surface of said substrate to form source and drain regions, (e) removing the portions of said refractory metal remaining over the field regions while allowing the refractory metal to remain over predetermined gate regions; (f) removing the exposed insulating regions and then oxidizing the surface of said substrate to form an oxide region at locations other than those protected by the remaining portion of refractory metal, (g) forming a thick oxide layer by thermal oxidation in areas not protected by said refractory metal, and (h) selectively forming a metalization pattern over said thick oxide regions and over said refractory metal.

2. The process of claim 1, further comprising the step of (f$_1$) introducing impurities of the same conductivity type as in the substrate through said oxide region into the surface of said substrate following said step (f).

3. The process of claim 1, further comprising the step of (g$_1$) selectively forming contact holes through said oxide region following said step (g).

4. The process of claim 1, wherein the portion of said refractory metal layer remaining after said step (c) acts as a barrier to the introduction of impurities into the portion of said substrate underlying said portion of refractory metal in said step (d), and the portion of said refractory metal layer remaining after said step (e) acts as a barrier to the thermal oxidation of the underlying portion of said substrate in said step (g).

5. The process of claim 4, in which the portion of said refractory metal layer remaining after the completion of said step (e) forms the gate electrode of an MOS transistor.

6. The method of claim 1, in which said refractory metal is selected from the group consisting of molybdenum silicide, platinum, and rhodium.

7. The process of claim 1, in which the portion of said refractory metal layer remaining after said oxidation step forms the gate electrode of an MOS transistor.

8. The process of claim 1, further comprising the step of introducing impurities of said first conductivity type into the surface of said substrate.

9. A process for fabricating an MOS device comprising the steps of providing a substrate of a first conductivity type, forming a refractory metal layer and an underlying insulating layer on said substrate, selectively removing portions of said refractory metal layer and said underlying insulating layer to define openings at the locations of source and drain regions, introducing impurities of an opposite conductivity type through said openings into the exposed upper surface of said substrate to form source and drain regions using the remaining portion of said refractory metal layer as a barrier to the impurities, removing an additional portion of said refractory metal while allowing refractory metal to remain over predetermined gate regions, oxidizing the surface of said substrate to form an oxide region at locations other than those protected by said refractory metal layer using the remaining refractory metal as an oxidation barrier, and thereafter selectively forming an overlying metalization pattern.

10. The process of claim 9, in which the portion of said refractory metal layer remaining after said oxidizing step forms the gate electrode of an MOS transistor.

11. The process of claim, 9, further comprising the step of introducing impurities of said first conductivity type into the surface of said substrate.

* * * * *